(12) United States Patent
Funk et al.

(10) Patent No.: US 10,510,512 B2
(45) Date of Patent: Dec. 17, 2019

(54) METHODS AND SYSTEMS FOR CONTROLLING PLASMA PERFORMANCE

(71) Applicant: Tokyo Electron Limited, Tokyo (JP)

(72) Inventors: Merritt Funk, Austin, TX (US);
Megan Doppel, Austin, TX (US);
Kazuki Moyama, Taiwa-cho (JP);
Chelsea DuBose, Austin, TX (US);
Justin Moses, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/880,435

(22) Filed: Jan. 25, 2018

(65) Prior Publication Data

US 2019/0228950 A1    Jul. 25, 2019

(51) Int. Cl.
*H01J 37/32* (2006.01)
*H01L 21/3065* (2006.01)

(52) U.S. Cl.
CPC .. *H01J 37/32146* (2013.01); *H01J 37/32165* (2013.01); *H01J 37/32174* (2013.01); *H01J 37/32954* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 6,444,137 B1 * | 9/2002 | Collins | C23C 16/402 216/67 |
| 6,893,907 B2 * | 5/2005 | Maydan | H01J 37/321 438/149 |
| 7,223,676 B2 * | 5/2007 | Hanawa | C23C 14/48 438/515 |
| 7,294,563 B2 * | 11/2007 | Al-Bayati | H01J 37/321 438/156 |
| 8,790,743 B1 * | 7/2014 | Omori | C23C 16/52 427/10 |
| 9,082,589 B2 * | 7/2015 | Thomas | H01J 37/321 |
| 9,368,329 B2 * | 6/2016 | Valcore, Jr. | H01J 37/32146 |
| 9,378,932 B2 * | 6/2016 | Tixhon | H01J 37/32348 |
| 9,406,485 B1 * | 8/2016 | Cheng | H01J 37/32183 |
| 9,918,376 B2 * | 3/2018 | Thomas | H01J 37/321 |
| 9,960,015 B2 * | 5/2018 | Valcore, Jr. | H01J 37/32082 |
| 10,128,083 B2 * | 11/2018 | Druz | H01J 27/18 |

(Continued)

*Primary Examiner* — Dion Ferguson
*Assistant Examiner* — Srinivas Sathiraju
(74) *Attorney, Agent, or Firm* — Oblon, McClelland, Maier & Neustadt, L.L.P.

(57) ABSTRACT

Embodiments of method and system for controlling plasma performance are described. In an embodiment a method may include supplying power at a first set of power parameters to a plasma chamber. Additionally, the method may include forming plasma within the plasma chamber using the first set of power parameters. The method may also include measuring power coupling to the plasma at the first set of power parameters. Also, the method may include supplying power at a second set of power parameters to the plasma chamber. The method may additionally include measuring power coupling to the plasma at the second set of power parameters to the plasma. The method may also include adjusting the first set of power parameters based, at least in part, on the measuring of the power coupling at the second set of power parameters.

20 Claims, 12 Drawing Sheets

(56) References Cited

U.S. PATENT DOCUMENTS

| | | | |
|---|---|---|---|
| 2004/0135590 A1* | 7/2004 | Quon | G01R 27/2641 |
| | | | 324/713 |
| 2004/0166612 A1* | 8/2004 | Maydan | H01J 37/321 |
| | | | 438/149 |
| 2004/0200417 A1* | 10/2004 | Hanawa | C23C 14/48 |
| 2005/0136604 A1* | 6/2005 | Al-Bayati | H01J 37/321 |
| | | | 438/301 |
| 2012/0211165 A1* | 8/2012 | Yoshikawa | H01L 21/68735 |
| | | | 156/345.41 |
| 2014/0097751 A1* | 4/2014 | Thomas | H01J 37/321 |
| | | | 315/111.21 |
| 2014/0166205 A1* | 6/2014 | Tian | G01B 11/02 |
| | | | 156/345.24 |
| 2014/0262040 A1* | 9/2014 | Zhao | H01J 37/32256 |
| | | | 156/345.41 |
| 2015/0126046 A1* | 5/2015 | Funk | H01J 37/32174 |
| | | | 438/798 |
| 2016/0268100 A1* | 9/2016 | Valcore, Jr. | H01J 37/32146 |
| 2017/0178864 A1* | 6/2017 | Valcore, Jr. | H01J 37/32082 |
| 2018/0261430 A1* | 9/2018 | Kawasaki | H01J 37/3299 |

* cited by examiner

METHODS AND SYSTEMS FOR CONTROLLING PLASMA PERFORMANCE

BACKGROUND OF THE INVENTION

Field of Invention

The present invention relates to systems and methods for substrate processing, and more particularly to a method and system for controlling plasma performance.

Description of Related Art

Plasma processing systems are used for etching substrates to form microelectronic or micromechanical devices. Plasma processing systems generate plasma by ionizing gases in a plasma processing chamber. Ionization is accomplished by exposing the gases to electromagnetic energy. Conventional hardware and processing techniques may result in non-uniform distribution of ions or plasma density across the substrate. Furthermore, conventional systems may not provide sufficient plasma density under certain processing conditions or with certain plasma gases.

Plasma stability is a factor in maintaining plasma distribution uniformity and plasma density profiles. Conventional hardware and processing techniques do not provide sufficient mechanisms for responsive control of plasma stability. The problem of plasma stability may be exacerbated with use of certain etch gas chemistries, in certain system architectures, or in certain applications. Prior systems are ill-equipped for providing consistently stable plasma fields in such circumstances. Consequently, product quality and throughput may be compromised.

SUMMARY OF THE INVENTION

Embodiments of method and system for controlling plasma performance are described. In an embodiment a method of controlling plasma performance in a system for treating a substrate may include supplying power at a first set of power parameters to a plasma chamber. Additionally, the method may include forming plasma within the plasma chamber using the first set of power parameters. The method may also include measuring power coupling to the plasma at the first set of power parameters. Also, the method may include supplying power at a second set of power parameters to the plasma chamber. The method may additionally include measuring power coupling to the plasma at the second set of power parameters to the plasma. The method may also include adjusting the first set of power parameters based, at least in part, on the measuring of the power coupling at the second set of power parameters.

An embodiment of a system for treating a substrate may include a first power source configured to supply power at a first set of power parameters to a plasma chamber, a second power source configured to supply power at a second set of power parameters to the plasma chamber, and a measurement device. The measurement device may be configured to: measure to supplying power at the first set of power parameters, and measure to the power at the second set of power parameters. The system may also include a power source controller configured to adjust the first power source to operate at the second set of power parameters in response to a determination that the plasma response meets a desired response condition.

Another embodiment of a system for treating a substrate may include a plasma chamber configured to contain a plasma for treating the substrate. The system may also include a power source configured to supply power at a first set of power parameters and power at a second set of power parameters to the plasma chamber. Additionally, the system may include a power transmission system configured to conduct the power from the power source to the plasma chamber. One or more measurements devices may be coupled to the power transmission system for measuring power coupling to the plasma. The system may also include a power source controller configured to adjust the first set of power parameters based, at least in part, the measuring of the power coupling at the second set of power parameters.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
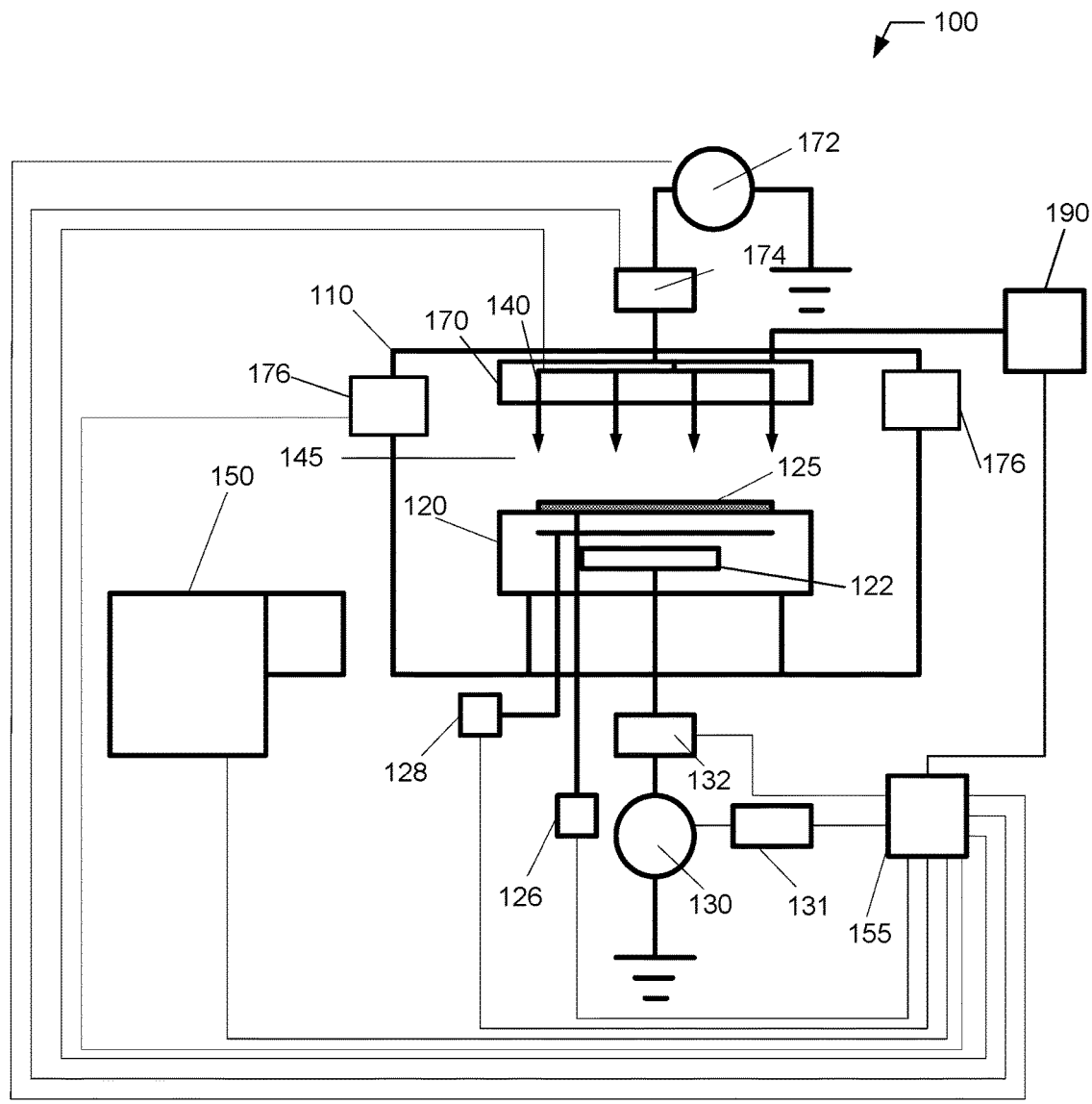
FIG. 1 illustrates one embodiment of a plasma etch system.

Methods and systems for controlling plasma performance are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

FIG. 1 is an embodiment of a system 100 for plasma etching. In an embodiment, the system 100 includes a processing chamber 110 having a substrate holder 120, upon which a wafer 125 to be processed is affixed, and a vacuum pumping system 150. The wafer 125 can be a semiconductor substrate, a wafer, a flat panel display, or a liquid crystal display. Processing chamber 110 can be configured to facilitate etching the processing region 145 in the vicinity of a surface of the wafer 125. An ionizable gas or mixture of process gases is introduced via a gas distribution system 140. For a given flow of process gas, the process pressure is adjusted using the vacuum pumping system 150.

The wafer 125 can be affixed to the substrate holder 120 via a clamping system (not shown), such as a mechanical clamping system or an electrical clamping system (e.g., an electrostatic clamping system). Furthermore, substrate holder 120 can include a heating system (not shown) or a cooling system (not shown) that is configured to adjust and/or control the temperature of substrate holder 120 and the wafer 125. The heating system or cooling system may comprise a re-circulating flow of heat transfer fluid that receives heat from substrate holder 120 and transfers heat to a heat exchanger system (not shown) when cooling, or transfers heat from the heat exchanger system to substrate holder 120 when heating. In other embodiments, heating/cooling elements, such as resistive heating elements, or thermo-electric heaters/coolers can be included in the substrate holder 120, as well as the chamber wall of the processing chamber 110 and any other component within the processing system 100.

Additionally, a heat transfer gas can be delivered to the backside of wafer 125 via a backside gas supply system 126 in order to improve the gas-gap thermal conductance between wafer 125 and substrate holder 120. Such a system can be utilized when temperature control of the wafer 125 is required at elevated or reduced temperatures. For example, the backside gas supply system can comprise a two-zone gas distribution system, wherein the helium gas-gap pressure can be independently varied between the center and the edge of wafer 125.

In the embodiment shown in FIG. 1, substrate holder 120 can comprise an electrode 122 through which RF power is coupled to the processing region 145. For example, substrate holder 120 can be electrically biased at a RF voltage via the transmission of RF power from a RF generator 130 through an optional impedance match network 132 to substrate holder 120. The RF electrical bias can serve to heat electrons to form and maintain plasma. In this configuration, the system 100 can operate as an RIE reactor, wherein the chamber and an upper gas injection electrode serve as ground surfaces.

Furthermore, the electrical bias of electrode 122 at a RF voltage may be pulsed using pulsed bias signal controller 131. The RF power output from the RF generator 130 may be pulsed between an off-state and an on-state, for example. Alternately, RF power is applied to the substrate holder electrode at multiple frequencies. Furthermore, impedance match network 132 can improve the transfer of RF power to plasma in plasma processing chamber 110 by reducing the reflected power. Match network topologies (e.g. L-type, π-type, T-type, etc.) and automatic control methods are well known to those skilled in the art.

Gas distribution system 140 may comprise a showerhead design for introducing a mixture of process gases. Alternatively, gas distribution system 140 may comprise a multi-zone showerhead design for introducing a mixture of process gases, and adjusting the distribution of the mixture of process gases above wafer 125. For example, the multi-zone showerhead design may be configured to adjust the process gas flow or composition to a substantially peripheral region above wafer 125 relative to the amount of process gas flow or composition to a substantially central region above wafer 125. In such an embodiment, gases may be dispensed in a suitable combination to form a highly uniform plasma within the chamber 110.

Vacuum pumping system 150 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 110.

In an embodiment, the source controller 155 can comprise a microprocessor, memory, and a digital I/O port capable of generating control voltages sufficient to communicate and activate inputs to processing system 100 as well as monitor outputs from plasma processing system 100. Moreover, source controller 155 can be coupled to and can exchange information with RF generator 130, pulsed bias signal controller 131, impedance match network 132, the gas distribution system 140, the gas supply 190, vacuum pumping system 150, as well as the substrate heating/cooling system (not shown), the backside gas supply system 126, and/or the substrate holder 120. For example, a program stored in the memory can be utilized to activate the inputs to the aforementioned components of processing system 100 according to a process recipe in order to perform a plasma assisted process, such as a plasma etch process or a post heating treatment process, on wafer 125.

In addition, the processing system 100 can further comprise an upper electrode 170 to which RF power can be coupled from RF generator 172 through optional impedance match network 174. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 155 is coupled to RF generator 172 and impedance match network 174 in order to control the application of RF power to upper electrode 170. The design and implementation of an upper electrode is well known to those skilled in the art. The upper electrode 170 and the gas distribution system 140 can be designed within the same chamber assembly, as shown. Alternatively, upper electrode 170 may comprise a multi-zone electrode design for adjusting the RF power distribution coupled to plasma above wafer 125. For example, the upper electrode 170 may be segmented into a center electrode and an edge electrode.

Depending on the applications, additional devices such as sensors or metrology devices can be coupled to the processing chamber 110 and to the source controller 155 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pulldown of structures (pulldown), slimming of structures (slimming), aspect ratio of structures (aspect ratio), line width roughness, substrate throughput, cost of ownership, and the like are achieved. Embodiments of such sensors are described with reference to the following figures.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

In another embodiment, the plasma chamber 110 may include an edge source 176 to provide power proximate to the sidewall of the plasma chamber 110. In this embodiment, the edge source 176 extends around the plasma chamber 110 and is incorporated into the sidewall. The edge source 176 may be used in conjunction with the upper electrode 170 to provide power into the plasma chamber 110 or it may be used without other power sources to generate plasma within the plasma chamber 110.

Figure 2:
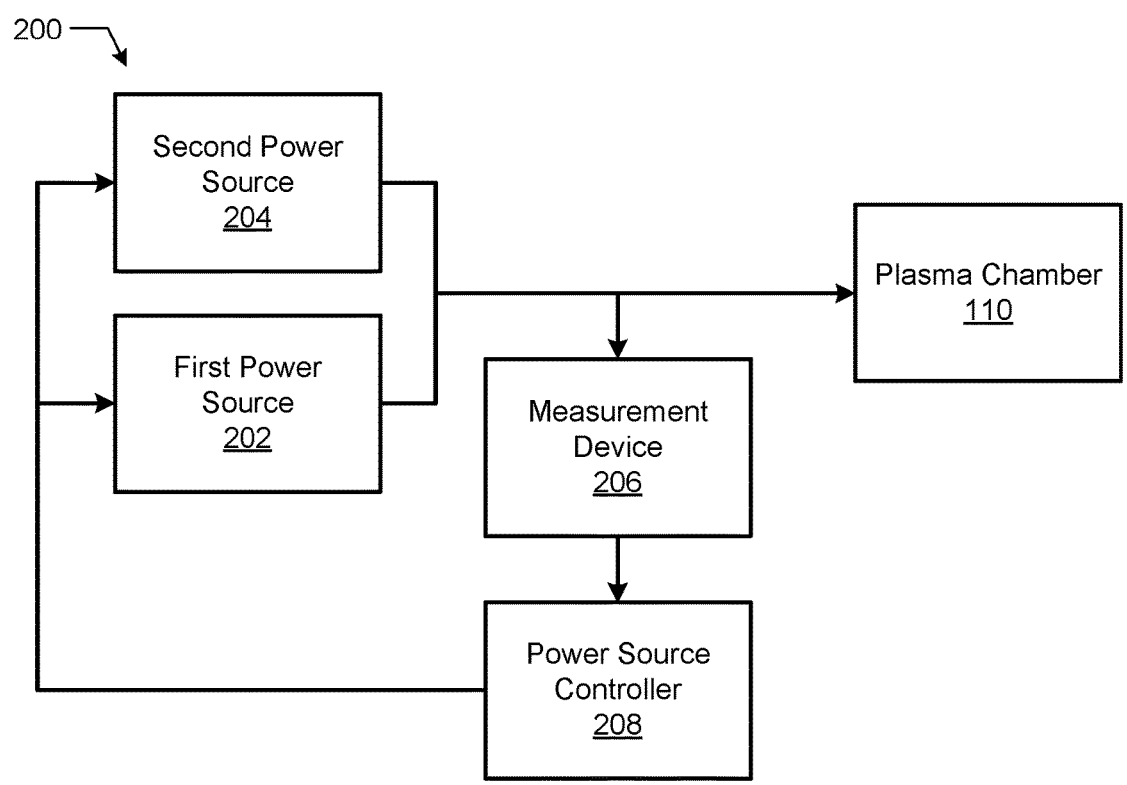
FIG. 2 illustrates one embodiment of a system for controlling plasma performance.

FIG. 2 illustrates one embodiment of a system 200 for controlling plasma performance. In an embodiment, the system 200 may be implemented integrally with the system 100 for plasma etching illustrated in FIG. 1. For example, aspects of the system 200 may be implemented in the source controller 155. Additionally, the system 200 may be coupled to the plasma chamber 110. In an embodiment, the plasma source controller may be implemented in the source controller 155. Alternatively, aspects of the system 200, may be implemented as separate, add-on or additional features of system 100.

In an embodiment, the system 200 may include a first power source 202 and a second power source 204. In an embodiment, the first power source 202 and the second power source 204 may be RF power generators. In a further embodiment, the first power source 202 and second power source 204 may be variable power generators. In various embodiments, the amplitude, frequency, phase, or other aspects of the supplied power may be varied according to system requirements and plasma performance.

The first power source 202 may be a primary power source, which is configured to supply power for plasma ignition and maintain plasma performance. In an embodiment, the second power source 204 may supply power at an intermittent test period for testing the response of the plasma to a change in one or more variable power characteristics, including for example, amplitude, frequency, phase, or other aspects. Further details of operations and algorithms used for switching between the first power source 202 and the second power source 204 are described below.

The system 200 may also include one or more measurement devices 206 configured to measure one or more aspects of the power supplied to the plasma chamber 110, the response of the plasma in the plasma chamber 110 to changes in the power supplied to the plasma chamber 110, or both.

The system 200 may further include a power source controller 208. In an embodiment, the power source controller 208 may control power output settings of the first power source 202 and the second power source 204. Additionally, the power source controller 208 may control switching between the power outputs of the first power source 202 and the second power source 204 supplied to the plasma chamber 110.

In one embodiment, the first power source 202 may be configured to supply power at a first set of power parameters to a plasma chamber. The second power source 204 may be configured to supply power at a second set of power parameters to the plasma chamber during a test period. The measurement device may be configured to measure a plasma response to supplying power at the first set of power parameters, and to measure a plasma response during the test period. In an embodiment, the power source controller 208 may be configured to adjust the first set of power parameters to match the second set of power parameters in response to a determination that the plasma response during the test period is improved compared to the plasma response to the first set of power parameters, the determination made according to one or more target processing objectives.

Figure 3:
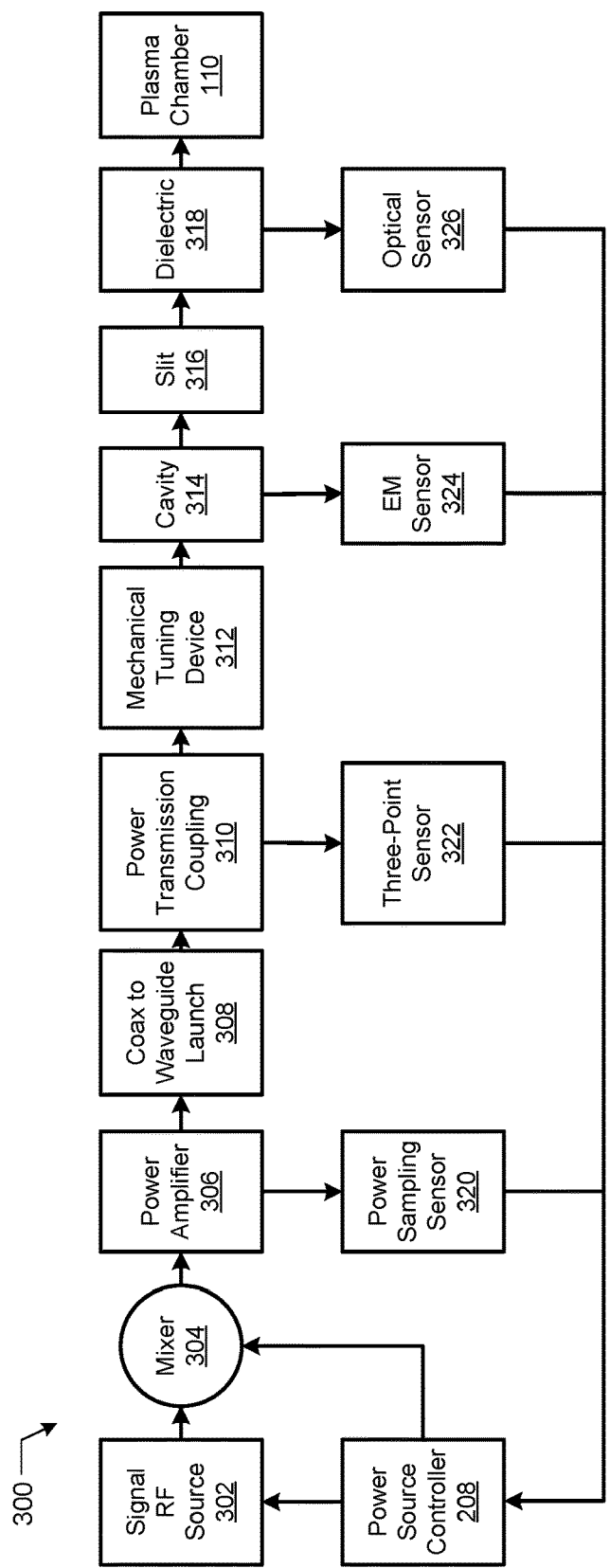
FIG. 3 illustrates one embodiment of a system for controlling plasma performance.

FIG. 3 illustrates a further embodiment of a system 300 for controlling plasma performance. In an embodiment, the system 300 may include a signal RF source 302. In one embodiment, the signal RF source 302 may include the first power source 202 and the second power source 204 described with relation to FIG. 2. In another embodiment, the signal RF source 302 may include a multi-output source capable of supplying power on a first set of power parameters on a first output and a second set of power parameters on a second output. A mixer 304, or other switching apparatus, may switch between the first power output and the second power output for testing a plasma response to variations in one or more power parameters, including amplitude, frequency, phase, or the like.

In an embodiment, the switched power signals may be provided to a power amplifier 306. The power amplifier may amplify the power signal to a level suitable for maintaining a plasma field in the plasma chamber 110. A power sampling sensor 320 may sample power supplied by the power amplifier 306. For example, the power sampling sensor 320 may measure forward power. In another embodiment, the power sampling sensor 320 may measure reflected power. One of ordinary skill will recognize that an alternative number of points may be measured by a multi-point sensor, each point separated by a known distance.

In an embodiment, the power transmission coupling 310 may be coupled to a mechanical tuning device 312 for providing adjustable mechanical tuning to the power supplied to the plasma chamber 110. A mechanical tuning device 312 may provide mechanical adjustment to electrical properties of the power supplied to the plasma chamber 110. Embodiments of mechanical tuning devices include adjustable waveguide stubs, where the length of the stub is adjusted to modify electrical properties of the power. An alternative embodiment includes an adjustable slit or iris in the waveguide, which may be adjusted to modify electrical properties of the power supplied to the plasma chamber 110.

In an embodiment, a cavity 314 may be coupled to the power transmission coupling 310. An electromagnetic (EM) sensor 324 may be configured to measure electromagnetic energy in the cavity 314. One of ordinary skill will recognize various EM sensors 324 that may be used in association with the present embodiments. A slit 316 or aperture may connect the cavity 314 to a dielectric 318 coupled to the plasma chamber 110. The energy emitted through the slit 316 may be distributed across the dielectric 318 for even distribution of electromagnetic radiation within the plasma chamber 110. In an embodiment, an optical sensor 326, such as a photo-diode sensor, may be coupled to the dielectric 318 for detecting an intensity of plasma within the plasma chamber 110. In an alternative embodiment, the optical sensor 326 may be coupled directly to the plasma chamber 110.

In an embodiment, an output of the power amplifier 306 may be coupled to a coaxial cable (coax) to waveguide launch 308. One of ordinary skill will recognize various coax to waveguide launch devices 308 that may be suitable for use with the present embodiments. In an embodiment, the coax to waveguide launch 308 may be coupled to a power transmission coupling 310, which may include a waveguide device. In an embodiment, multi-point sensor, such as three-point sensor 322 may measure a standing wave formed in the waveguide coupled between the plasma chamber 110 and the power source 302 configured to supply power to the plasma chamber 110. For example, the three-point sensor 322 may take measurements of power in the waveguide at three points of the standing wave, each point separated by a known distance. In a specific embodiment, the known distance may be one eight (⅛) of a wavelength of the standing wave.

In such an embodiment, feedback signals from one or more of the power sampling sensor 320, the three-point sensor 322, the EM sensor 324 and/or the optical sensor 326 may be provided to the power source controller 208. In such an embodiment, the power source controller 208 may provide operational signals to the signal RF source 302 and to the mixer 304 for controlling the power supplied to the plasma chamber 110 within a specific time interval.

One of ordinary skill will recognize that one or more additional components may be added to the system of FIG. 3 to enhance operation of the methods and processes described herein. Further, one of ordinary skill will recognize that one or more components of the system of FIG. 3 may be omitted, depending upon system requirements and hardware availability. The embodiment of FIG. 3 is merely illustrative of options that may be used in conjunction with the present embodiments, but is not intended to limit the scope of the present invention to any particular embodiments.

Figure 4:
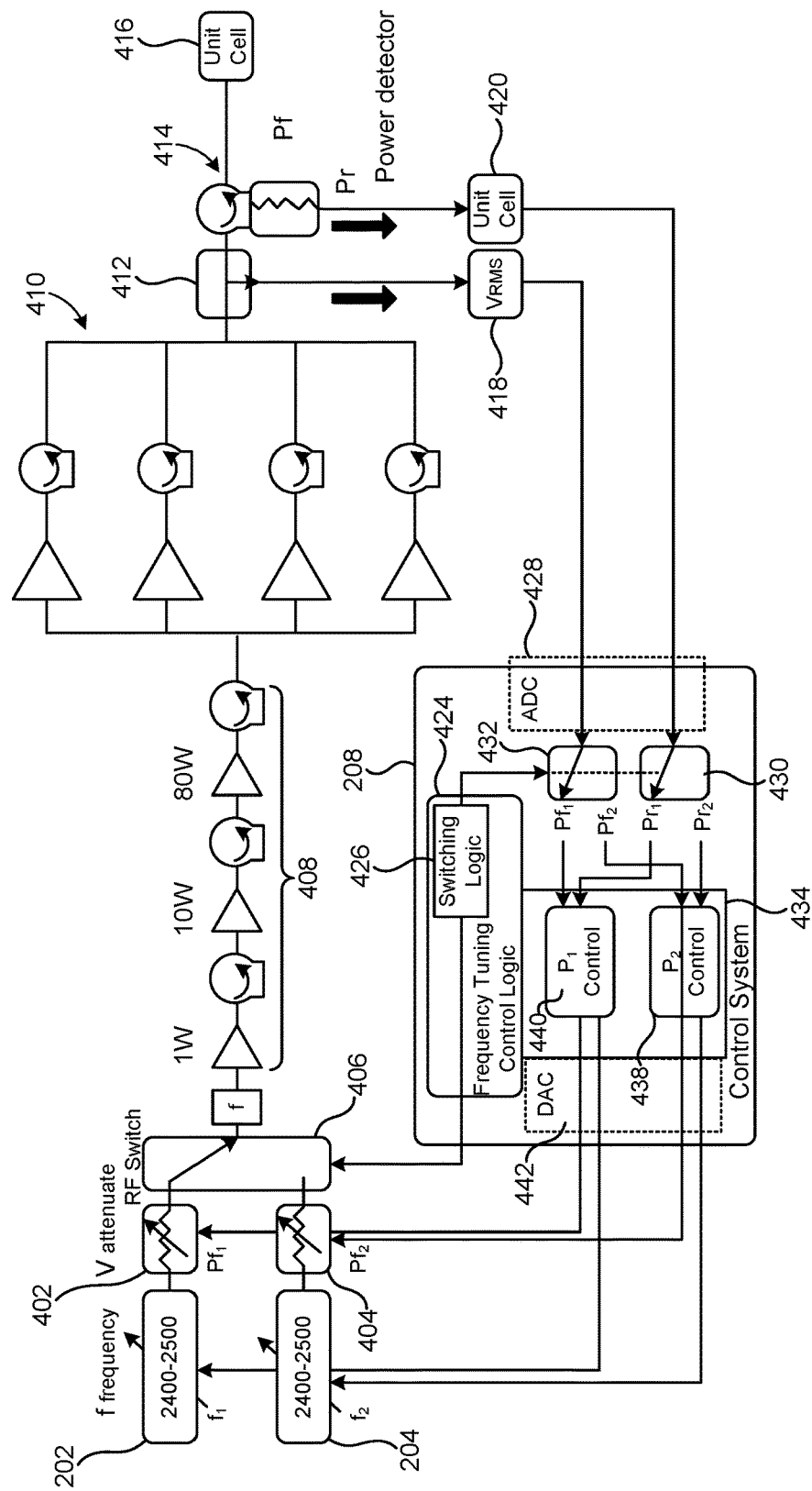
FIG. 4 illustrates one embodiment of a system for controlling plasma performance.

FIG. 4 illustrates another embodiment of a system for controlling plasma performance. In an embodiment, the system includes a first power source 202 and a second power source 204. The first power source 202 and the second power source 204 may be configured to operate in a variable frequency range of 2400 MHz to 2500 MHz. Additionally, the system may include a first attenuator 402 and a second attenuator 404 for adjusting an amplitude of the output of the first power source 202 and the second power source 204. An RF switch 406 may be configured to switch between the output of the first power source 202 and the second power source 204. The power amplifier 306 may include a plurality of power amplifier devices and circulator devices arranged in a series configuration 408 and/or in a parallel configuration 410. In an embodiment, the power sampling sensor 320 may include, for example, a directional coupler 412 for detecting forward power or a reflected power sensor 414 for detecting reflected power. In an embodiment, the reflected power sensor 414 may include a circulator and power resistor device.

In an embodiment, the circuit of FIG. 4 may include root mean squared (RMS) Voltage measurement devices (VRMS) for preparing measured signals for input into the power source controller 208. In this embodiment, a forward VRMS 418 may be coupled between the directional coupler 412 and the power source controller 208 to monitoring the forward power and a reflected VRMS 420 for monitoring the reflected power in the plasma source 416 within the plasma chamber 110.

The power source controller 208 may include an analog to digital converter (ADC) 428 and one or more switching devices 430 and 432 for switching between measurements captured in a first state and measurements captured in a second state. In an embodiment, frequency tuning control logic 426 may include switching logic 424 for synchronizing switching between the switching devices 430 and 432 and the RF switch 406.

Additionally, power control system 434 may include a first power control 440 and a second power control 438 configured to provide a control signal for controlling the output frequency, in the example of FIG. 4, of the first power source 202 and the second power source 204 respectively. In an embodiment, a digital to analog controller (DAC) 442 may convert the control signals for use by the first power source 202 and the second power source 204. The frequency tuning control logic 426 and the control system 434 may be programmatically configured according to the methods and functional examples described herein, and equivalents that may be recognizable to one of ordinary skill in the art.

Figure 5:
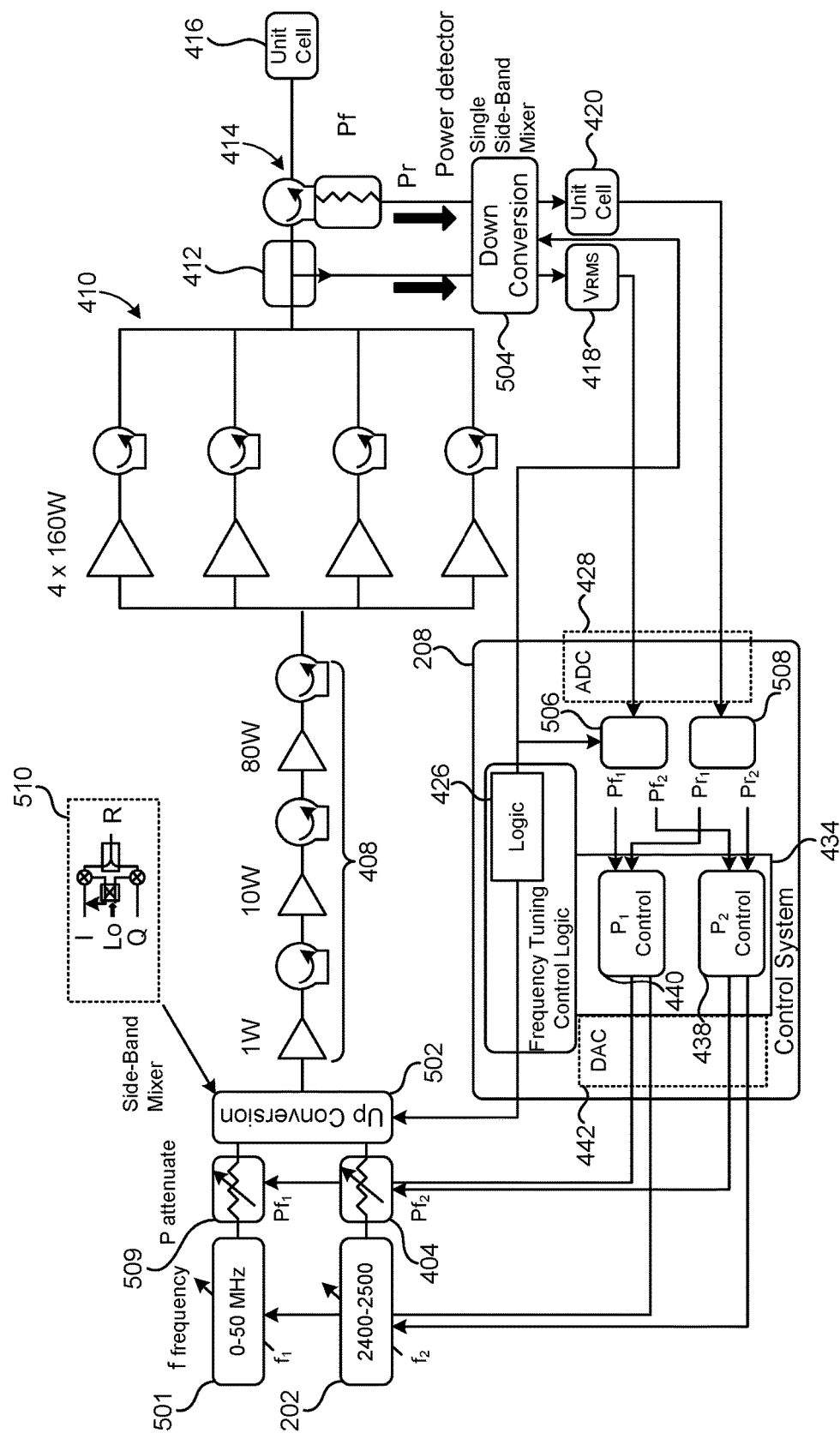
FIG. 5 illustrates one embodiment of a system for controlling plasma performance.

FIG. 5 illustrates another embodiment of a system for controlling plasma performance. One difference between the embodiment of FIG. 5 and the embodiment of FIG. 4 is that FIG. 5 uses an up converter 502 and a down converter 504 to mix signals produced by a first power source 202 and a second power source 501. The first power source 202 may produce a power signal at a frequency in the range of 2400-2500 MHz, for example. One of ordinary skill will recognize alternative frequency ranges that may be suitable for various applications or with various etch chemistries. The second power source 501 may be configured to generate a sideband signal with an offset from the primary signal produced by the first power source 202. In an embodiment, the offset of the sideband signal may be in the range of 0-50 MHz. Thus, in one example, if the first power source generates a primary signal at a frequency of 2450 MHz, then the second power source may generate a sideband frequency in the range of 2400-2500 MHz, which is a range of +/−50 MHz from the center frequency of 2450 MHz.

In a further embodiment, the attenuator 509 may attenuate the sideband signal generated by the second power source 501, such that mixing the sideband signal with the primary signal from the first power source 202 by the upconverter 502 does not interfere with plasma performance, except to a degree that is of interest for measurement or testing of a frequency change of the first power source 202. In such an embodiment, the second power source 501 may sweep across an entire range of frequencies, and the downconverter may extract the frequency response of the plasma over the range of the sweep. Thus, a frequency response profile over a range of frequencies may be determined, and a suitable operating frequency may be determined within that range by the control system 208. In such an embodiment, the upconverter 502 and the down converter 504 may take the place of the RF switch 406 and switching devices 430 and 432. The logic 426 may provide control signals to the upconverter 502 and the down converter 504, as well as converter devices 506 and 508. An exemplary design of the upconverter 502, an upconverter design 510, is also shown in FIG. 5 to illustrate a circuit design configured to using I and Q signals and adjusting the frequency and phase to control the sideband. Correspondingly, the downconverter 504 is the reverse operation extracting the measured signals. Physical implementation of mixing the first and second signal and extraction of the plasma response can be implemented with complex waveforms that allows for any arbitrary waveform enabling pulsing of the plasma and extracting the tuning information at time position in a pulsed waveform.

Figure 6:
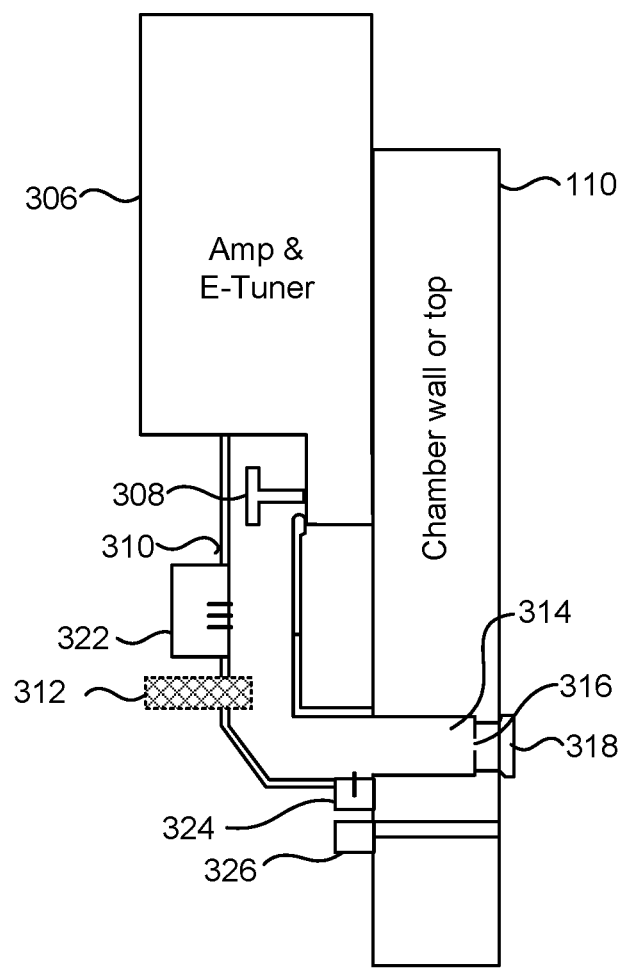
FIG. 6 illustrates one embodiment of a system for controlling plasma performance.

FIG. 6 is a block diagram of one embodiment of a system for controlling plasma performance, which illustrates one physical arrangement of system components. In an embodiment, the coax to waveguide launch 308 may be coupled to the power transmission coupling 310 as shown. In an embodiment, the optical sensor 326 may be coupled to the plasma chamber 110 to enable line-of-sight with any plasma formed in the plasma chamber 110. In an embodiment, the three-point sensor 322 may be coupled to the power transmission coupling 310.

The mechanical tuning device 312 may include an adjustable waveguide stub, an adjustable slit, an adjustable iris, or the like. In an embodiment, the mechanical tuning device 312 may include a single tuning component. Alternatively, the mechanical tuning device 312 may include multiple tuning components.

In an embodiment, the electromagnetic sensor 324 may include an E-field pickup device. In such an embodiment, the electromagnetic sensor 324 may measure total power at the cavity 314.

Figure 7:
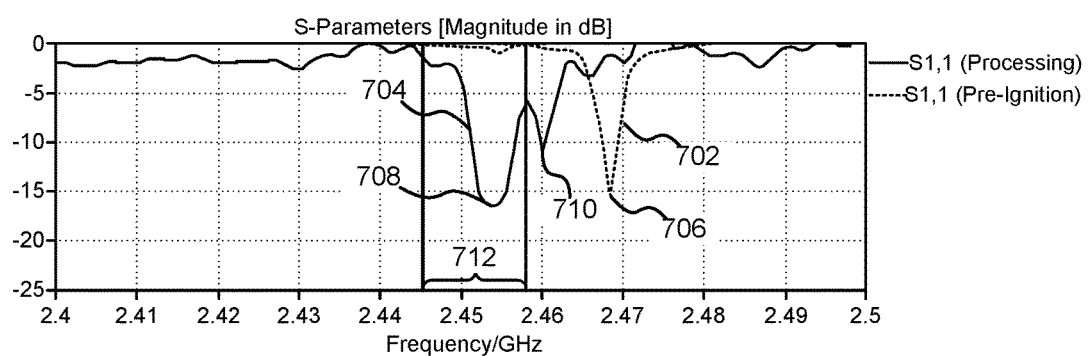
FIG. 7 illustrates one embodiment of an apparatus for measuring resonant energy in a cavity associated with a power source.

FIG. 7 is a graphical representation of S-parameter data collected corresponding to reflected power measured in a system for controlling plasma performance. In the example of FIG. 7, the frequency was swept across a range of 2.4 GHz to 2.5 GHz. The reflected power was measured before ignition of the plasma as represented by curve 702 and after ignition of the plasma during semiconductor processing as represented by curve 704. During plasma ignition, a sharp drop in the reflected power can be observed at around 2.47 GHz, as shown at 706, which corresponds to the primary frequency of power coupling of the plasma gasses. During processing, the frequency of the sharp drop shifts to around 2.455 GHz., as shown at 708 As observed, another sharp drop occurs at 2.46 GHz as shown at 710. In an embodiment, it may be desirable to limit the range 712 of sweeping for frequency stability to a region from 2.445 GHz to 2.455 GHz, to avoid shifting the operating frequency of the first power source 202 to a false null at the frequency shown in 710.

In such embodiments, an operating frequency for the first power source 202 may be selected at a frequency that is unlikely to result in a sharp increase of reflected power, which would cause instability in the plasma, such as flickering plasma or extinguished plasma. The measured reflected power is directly correlated to the power coupling of the plasma at each given frequency.

Figure 8:
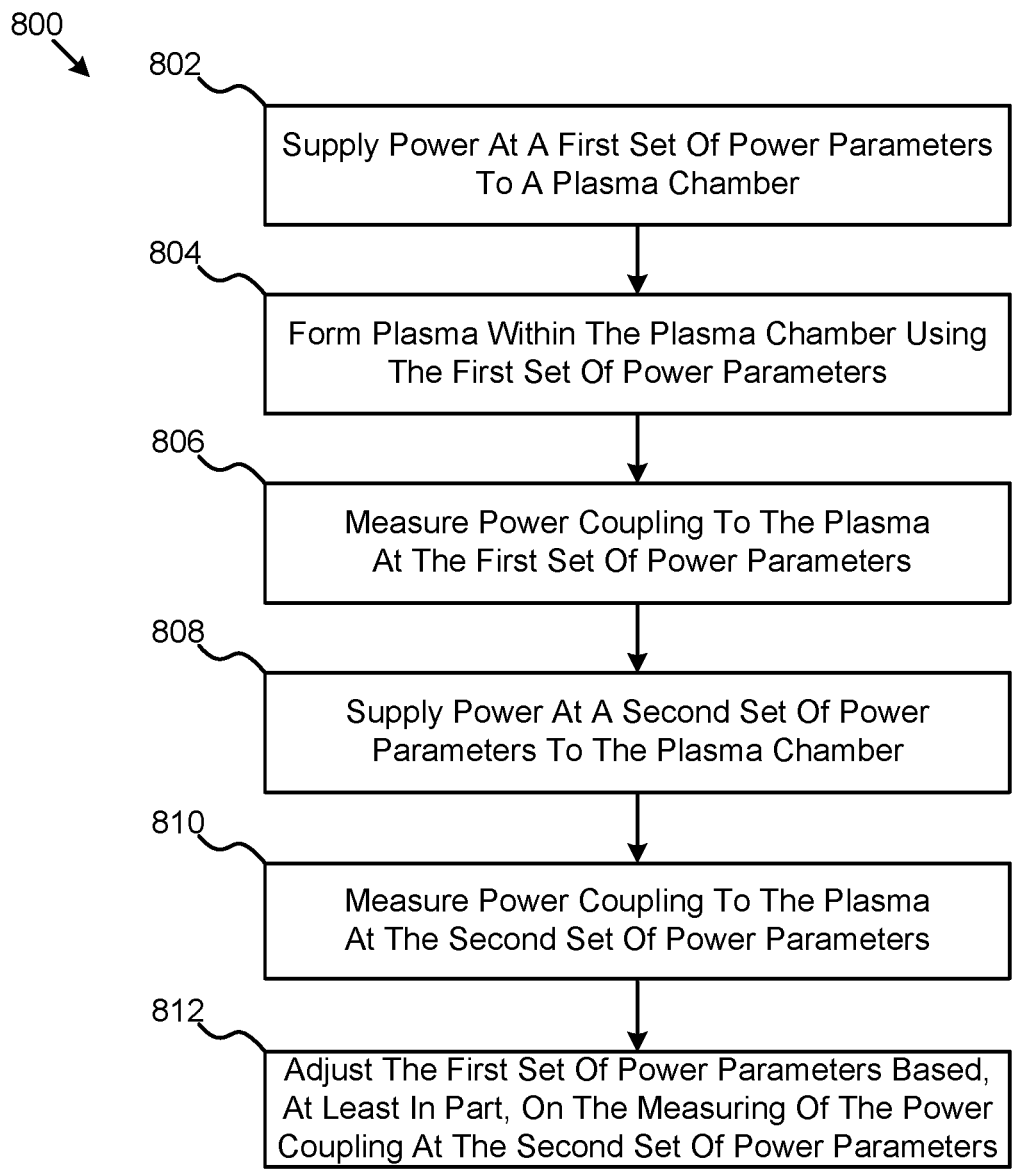
FIG. 8 illustrates one embodiment of a method for controlling plasma performance.

FIG. 8 illustrates one embodiment of a method 800 for controlling plasma performance according to the present embodiments. In an embodiment a method 800 of controlling plasma performance in a system for treating a substrate may include supplying power at a first set of power parameters to a plasma chamber as shown at block 802. Additionally, at block 804, the method 800 may include forming plasma within the plasma chamber using the first set of power parameters. The method 800 may also include measuring power coupling to the plasma at the first set of power parameters as shown at block 806. Also, at block 808, the method 800 may include supplying power at a second set of power parameters to the plasma chamber. At block 810, the method 800 may additionally include measuring power coupling to the plasma at the second set of power parameters to the plasma. The method may also include adjusting the first set of power parameters based, at least in part, on the measuring of the power coupling at the second set of power parameters.

Figure 9:
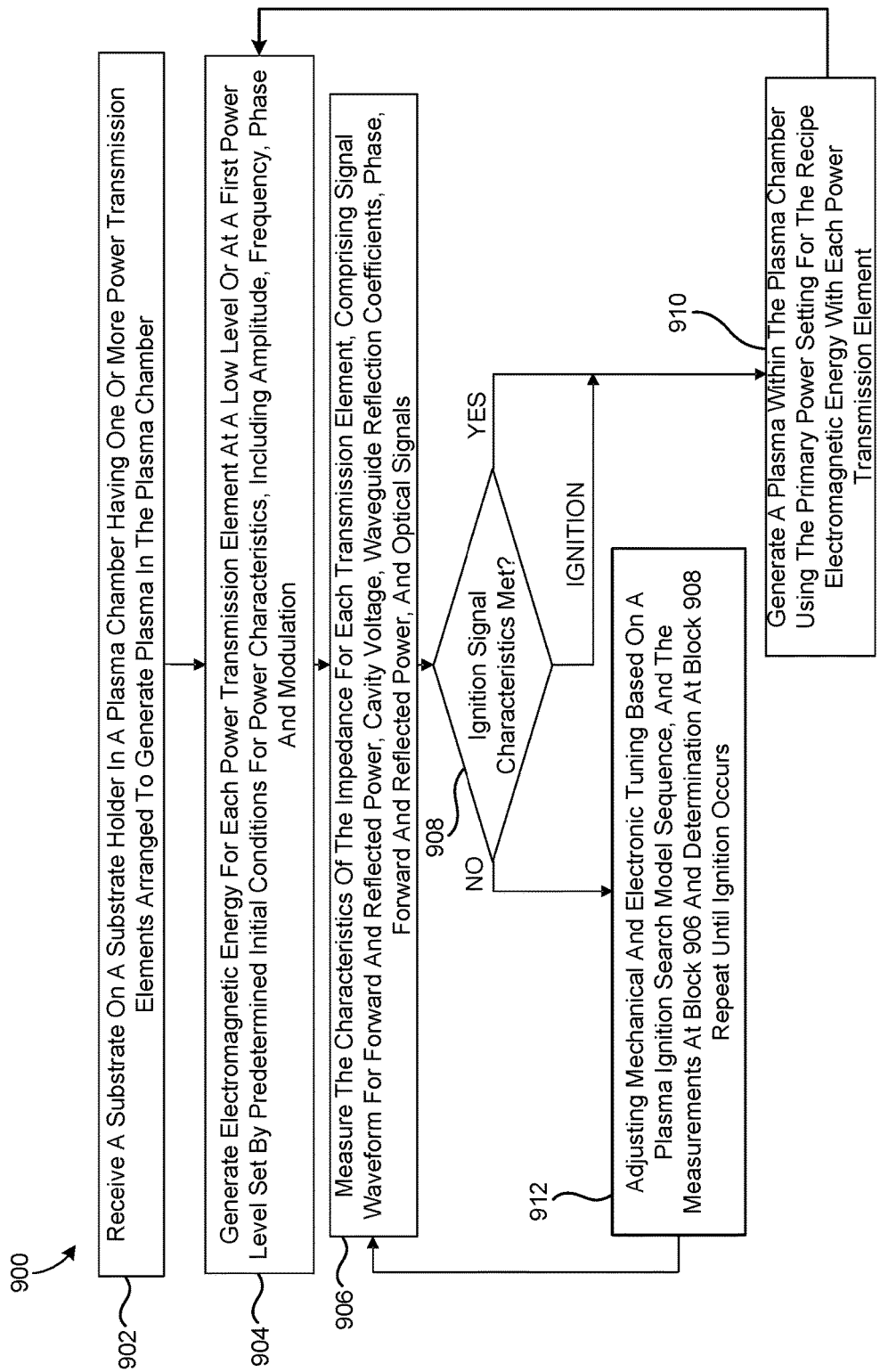
FIG. 9 illustrates one embodiment of a method for controlling plasma ignition.

FIG. 9 illustrates one embodiment of a method 900 for igniting a plasma in a plasma chamber 110. At block 902, the method 900 includes receiving a substrate on a substrate holder in a plasma chamber having one or more power transmission elements arranged to generate plasma in the plasma chamber. At block 904, the method 900 includes generating electromagnetic energy for each power transmission element at a low level or at a first power level set by predetermined initial conditions for power characteristics, including amplitude, frequency, phase and modulation. Additionally, mechanical and electrical tuning settings may be set.

Block 906 includes measuring the characteristics of the impedance for each transmission element, comprising signal waveform for forward and reflected power, cavity voltage, waveguide reflection coefficients, phase, forward and reflected power, and optical signals. At block 908, a determination is made as to whether predetermined ignition signal characteristics are met. If so, plasma ignition occurs and at block 910 a plasma is generated within the plasma chamber using the primary power setting for the recipe electromagnetic energy with each power transmission element. If not, the method 900 includes adjusting the electromagnetic controls comprising power, signal waveform parameters, such as frequency, phase and modulation, and the like. Additionally, block 912 may include adjusting mechanical and electronic tuning based on a plasma ignition search model sequence, and the measurements at block 906 and determination at block 908 repeat until ignition occurs.

Figure 10:
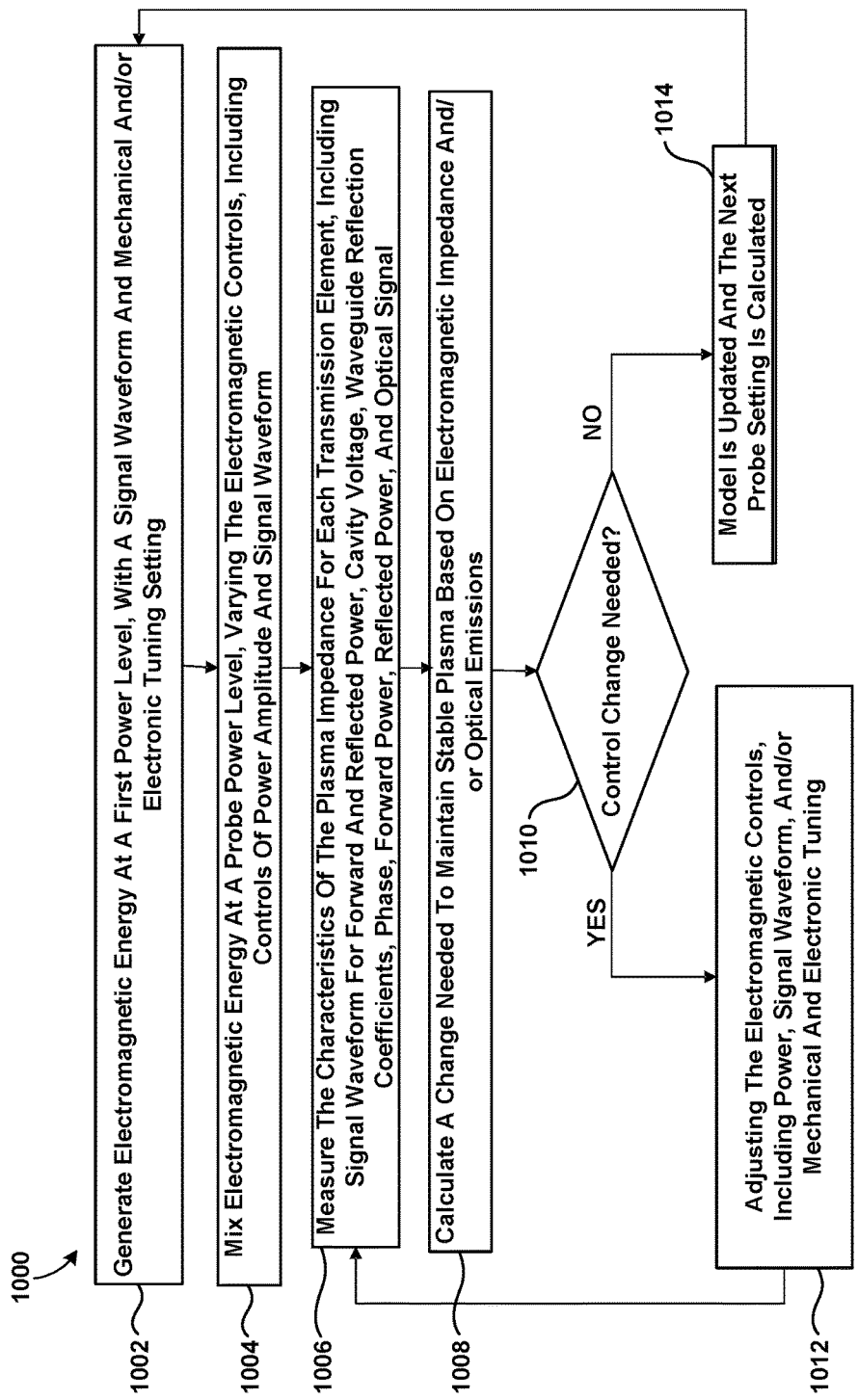
FIG. 10 illustrates one embodiment of a method for controlling plasma performance.

FIG. 10 illustrates an embodiment of a method 1000 for maintaining a plasma in the plasma chamber. At block 1002, the method 1000 includes generating electromagnetic energy at a first power level, with a signal waveform and mechanical and/or electronic tuning setting. The method 1000 also includes mixing electromagnetic energy at a probe power level, varying the electromagnetic controls, including controls of power amplitude and signal waveform, as shown at block 1004. Block 1006 includes measuring the characteristics of the plasma impedance for each transmission element, including signal waveform for forward and reflected power, cavity voltage, waveguide reflection coefficients, phase, forward power, reflected power, and optical signal. At block 1008, the method includes calculating a change needed to maintain stable plasma based on electromagnetic impedance and/or optical emissions. In a further embodiment, the method may include checking deadbands and calculating a suitable tuning adjustment.

At block 1010 a determination is made of whether a control change is needed to maintain the stable plasma. If so, the method 1000 may include adjusting the electromagnetic controls, including power, signal waveform, and/or mechanical and electronic tuning, as shown at block 1012. If not, the model is updated and the next probe setting is calculated as shown at block 1014.

Figure 11:
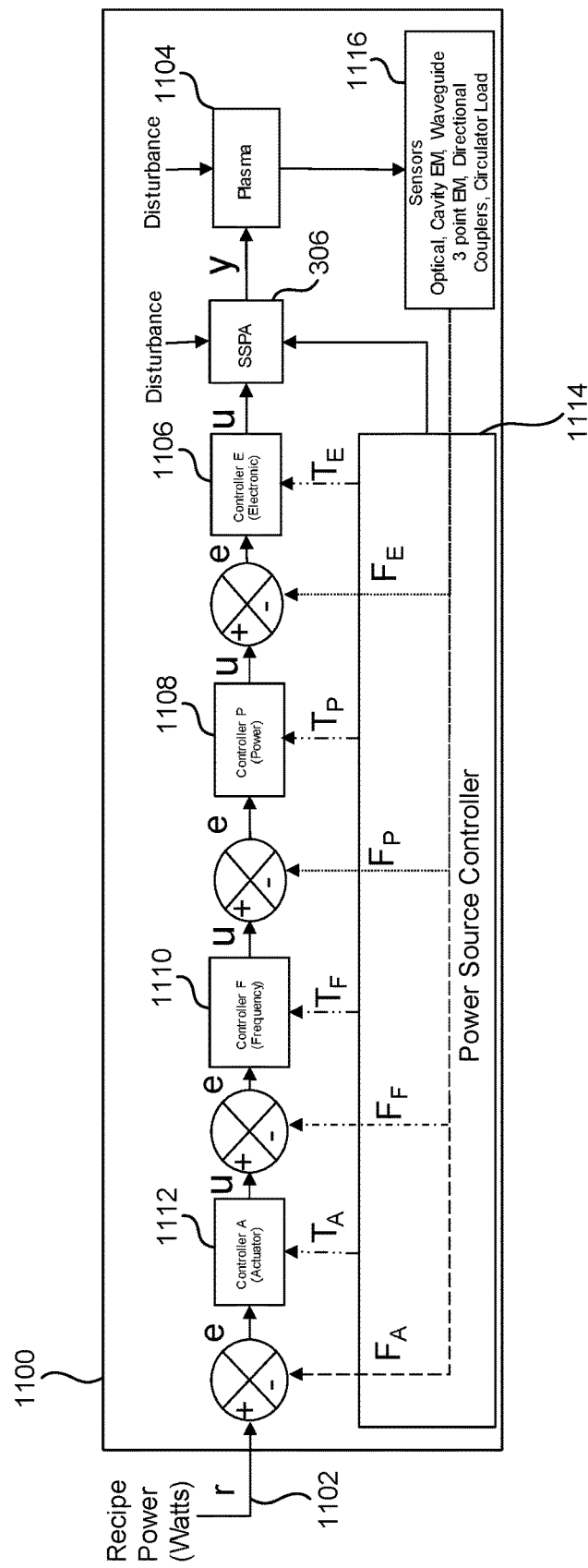
FIG. 11 is a diagram illustrating a control system for controlling plasma performance.

FIG. 11 illustrates a control loop 1100 for controlling plasma performance. In an embodiment, the control loop 1100 may be an iterative loop. The control loop may receive a specified recipe power 1102 as input and preset values. In one embodiment, the plasma may be ignited according to the method 900 described in FIG. 9. The power amplifier 306 may provide power to the plasma chamber 110 thereby creating the plasma source 1104 being monitored by the sensors 1106. One or more sensors 1116 may measure one or more characteristics of the plasma response the prescribed power characteristics. In response to the measurements, the signal distribution controller 1114 may adjust an electronic tuning setting as shown at control block 1106. The electronic tuning control updates may be coordinated for plasma power control plan defined by the recipe. Next, at block 1108, the power amplitude setting maybe iteratively updated until a threshold plasma measurement is met.

In coordination with power amplitude level, 1108, the electronic tuning setting may be updated again at block 1106. Then, the amplitude setting may be adjusted at block 1108 for a second time. Then, the frequency tuning setting may be controlled at block 1110. The sequence of iteratively controlling the electronic tuning settings at block 1106 and the power amplitude settings at block 1108 may be repeated, then the mechanical tuning may be iteratively controlled at block 1112, and the process may repeat.

Figure 12:
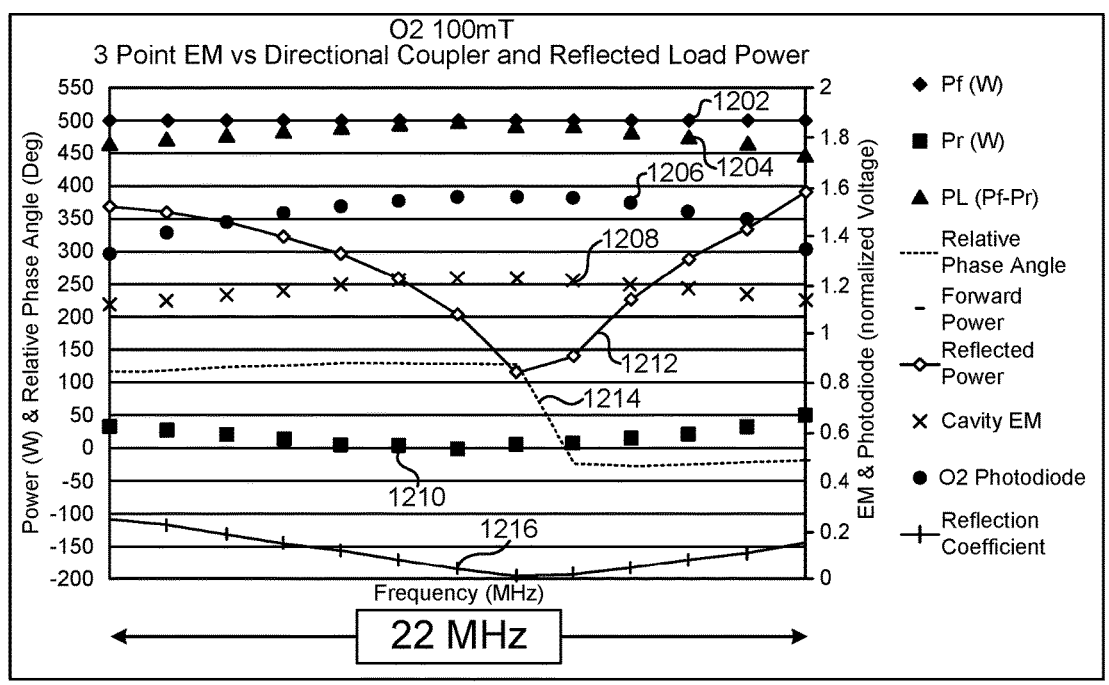
FIG. 12 is a diagram illustrating the effects of power amplitude and frequency variation on sensor signal levels.

FIG. 12 illustrates sample test data from an operational test performed in a plasma chamber with a plasma recipe that includes 100 mT of O2 with fixed mechanical tuning. Various measurements, including the forward power 1202, reflected power 1210, delivered power 1204, power detected in the power transmission coupling 1208, and detected plasma intensity 1206. The power frequency was varied over a range of 2.444 GHz to 2.466 GHz. As shown, the reflected power 1210 drops at a frequency of about 2.458 GHz. Correspondingly, the plasma intensity 1206, the power in the power transmission coupling 1208, the forward power 1202 and the delivered power 1204 each peak at or around 2.458 GHz. Thus, a frequency of about 2.458 GHz may be set to provide comparatively superior plasma performance with reference to frequency response.

As shown at curve 1214, the phase angle includes a corresponding shift at the same frequency as the null in reflected power. A corresponding drop in reflection coefficient 1216 is also observed at the frequency of the null in reflected power 1210.

One of ordinary skill will recognize that the test data is only indicative of test performed in one embodiment of a system, at one specified set of frequency values. Similarly, the test results may be limited to response of the specified recipe. Thus, the data represented in FIG. 12 is not limiting of the present embodiments, but is illustrative of the efficacy of the described embodiments.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method of controlling plasma performance in a system for treating a substrate, the method comprising:
   supplying power at a first set of power parameters to a plasma chamber;
   forming plasma within the plasma chamber using the first set of power parameters;
   measuring power coupling to the plasma at the first set of power parameters;
   supplying power at a second set of power parameters to the plasma chamber;
   measuring power coupling to the plasma at the second set of power parameters to the plasma; and
   adjusting the first set of power parameters based, at least in part, on the measuring of the power coupling at the second set of power parameters, wherein measuring the power coupling to the plasma includes at least measuring a resonant power and an intensity of power provided to the plasma chamber.

2. The method of claim 1, wherein measuring the power coupling of the second set of power parameters further comprises measuring forward power in a power source configured to supply power to the plasma chamber.

3. The method of claim 1, wherein measuring the power coupling of the second set of power parameters further comprises measuring reflected power in a power source configured to supply power to the plasma chamber.

4. The method of claim 1, wherein measuring the power coupling of the second set of power parameters further comprises measuring the resonant power in a cavity coupled between the plasma chamber and a power source configured to supply power to the plasma chamber.

5. The method of claim 4, wherein measuring the resonant power further comprises measuring at a plurality of points of the cavity, each point separated by a known distance.

6. The method of claim 1, wherein measuring the power coupling of the second set of power parameters further comprises measuring electromagnetic energy at an interface to the plasma chamber.

7. The method of claim 1, wherein measuring the power coupling of the second set of power parameters further comprises optically measuring the plasma with a photodetector device.

8. The method of claim 1, wherein supplying power at the second set of power parameters further comprises switching between a first power source and a second power source, the first power source configured to supply power at the first set of power parameters and the second power source configured to supply power at the second set of power parameters.

9. The method of claim 1, wherein supplying power at the second set of power parameters further comprises mixing a sideband signal configured according to the second set of power parameters with the power supplied at the first set of power parameters.

10. The method of claim 9, wherein mixing the sideband signal is performed using an upconverter device, and a down converter to extract a response signal.

11. The method of claim 1, wherein the second set of power parameters is variable.

12. The method of claim 11, further comprising controlling settings of the second set of power parameters using a control loop that receives feedback from one or more measurement devices, each measurement device configured to measure the power coupling at the second set of power parameters.

13. The method of claim 1, wherein adjusting the first set of power parameters is performed by a cascaded control loop configured to control configuration of a plurality of components of the first set of power parameters according to a cascaded control loop process.

14. The method of claim 1, wherein adjusting the first set of power parameters further comprises adjusting a frequency of power supplied to the plasma chamber.

15. The method of claim 1, wherein adjusting the first set of power parameters further comprises adjusting a magnitude of a power supplied to the plasma chamber.

16. The method of claim 1, wherein adjusting the first set of power parameters further comprises adjusting a mechanical tuning device coupled to a power source configured to supply power to the plasma chamber.

17. The method of claim 1, wherein adjusting the first set of power parameters further comprises adjusting an electronic electromagnetic energy matching device coupled to a power source configured to supply power to the plasma chamber.

18. A system for treating a substrate, comprising:
a first power source configured to supply power at a first set of power parameters to a plasma chamber;
a second power source configured to supply power at a second set of power parameters to the plasma chamber;
a measurement device configured to:
  measure to supplying power at the first set of power parameters; and
  measure to the power at the second set of power parameters including at least a resonant power and an intensity of power; and
a power source controller configured to adjust the first power source to operate at the second set of power parameters in response to a determination that the plasma response meets a desired response condition.

19. A system for treating a substrate, comprising:
a plasma chamber configured to contain a plasma for treating the substrate;
a power source configured to supply power at a first set of power parameters and power at a second set of power parameters to the plasma chamber;
a power transmission system configured to conduct the power from the power source to the plasma chamber;
one or more measurements devices coupled to the power transmission system for measuring power coupling to the plasma including at least a resonant power and an intensity of power; and
a power source controller configured to adjust the first set of power parameters based, at least in part, the measuring of the power coupling at the second set of power parameters.

20. The system of claim 19, wherein the one or more measurement devices include at least one of:
a power sampling sensor coupled to a power amplifier component of the power transmission system, the power sampling sensor configured to measure reflected power;
a multi-point sensor coupled to a power transmission coupling component of the power transmission system, the multi-point sensor configured to measure the resonant power in the power transmission coupling;
an electromagnetic sensor coupled to a cavity component of the power transmission system, the electromagnetic sensor configured to measure the intensity of power provided to the plasma chamber; and
an optical sensor configured to measure an intensity of light produced by the plasma formed in the plasma chamber.

* * * * *